United States Patent [19]

Pearman et al.

[11] Patent Number: 4,641,089
[45] Date of Patent: Feb. 3, 1987

[54] AMMETER APPARATUS AND METHOD FOR CAPTURING CURRENT READINGS

[75] Inventors: Bruce W. Pearman, Colorado Springs, Colo.; Hal A. Huggins, 106 E. Cheyenne Rd., Colorado Springs, Colo. 80906

[73] Assignee: Hal A. Huggins, Colorado Springs, Colo.

[21] Appl. No.: 489,062

[22] Filed: Apr. 27, 1983

[51] Int. Cl.[4] .............................................. G01R 19/04
[52] U.S. Cl. ................................. 324/103 P; 324/119; 433/32
[58] Field of Search ................. 324/103 P, 102, 99 D, 324/119, 115; 307/351, 352, 353; 433/32

[56] References Cited

U.S. PATENT DOCUMENTS

| | | | |
|---|---|---|---|
| 3,878,984 | 4/1975 | Sotiropoulos et al. | 324/103 P X |
| 4,175,252 | 11/1979 | Shinoda | 324/103 P |
| 4,301,407 | 11/1981 | Koslar | 324/103 P X |
| 4,311,960 | 1/1982 | Barr | 324/103 P |
| 4,339,712 | 7/1982 | Walters | 324/103 P X |
| 4,373,141 | 2/1983 | Sanders | 307/353 X |

FOREIGN PATENT DOCUMENTS 547777 4/1977 U.S.S.R. .......................... 324/103 P

OTHER PUBLICATIONS

Hynds, J., "Auto Peak Detector for Use With Pen Plotters", Electronic Product Design, Mar. 1982, p. 26.
Montano, J., "Bipolar S/H With Indefinite Hold Time, Digital O/P", Electronic Engineering, Jul. 1979, vol. 51, No. 625, pp. 25-27.

Primary Examiner—Reinhard J. Eisenzopf
Assistant Examiner—Stephen M. Baker
Attorney, Agent, or Firm—Timothy J. Martin

[57] ABSTRACT

An ammeter apparatus and method of taking current reading includes current inputs receiving a signal from a current source through a suitable gate. A conversion circuit having a preamplifier and an amplifier, in inverted configuration, produce a signed voltage proportional to the current signal. The signed voltage is passed, to both a rectifier and a polarity indicator through another gate. A comparator switches the polarity indicator gate and a third gate upon receipt of a threshold value rectified voltage from the rectifier. The third gate interconnects the rectifier and a charge-retaining element, and a meter outputs a display corresponding to the charge thereon. A fourth gate connects the charge-retaining element to ground in order to discharge the retained charge. A timing circuit with a manual override operates the input gate and the fourth gate, and a timed power supply provides operating voltage for the circuit. The method includes the steps of detecting the current, producing a signed voltage therefrom, outputting the voltage polarity, rectifying the signed voltage, and outputting and displaying the greatest voltage value occurring in a selected interval of time.

27 Claims, 6 Drawing Figures

AMMETER APPARATUS AND METHOD FOR CAPTURING CURRENT READINGS

BACKGROUND OF THE INVENTION

The present invention relates to an ammeter device including circuitry for accurately measuring a small electric current and capturing the peak current reading that occurs during a selected time interval. The design, then, is particularly adapted for measuring small discharge currents, for example, from a charged capacitor or from a small battery having a high internal resistance. In accomplishing this, the device measures the polarity of the discharged current.

The construction of the device is particularly adaptable for measuring small discharge currents generated by an amalgam dental filling located in the human mouth. As can be appreciated, an amalgam filling is composed of two or more dissimilar metals, and the filling is subjected to an acidic bath in the form of saliva. That being the case, a filling functions as a small battery having a high internal resistance. When an electrical connection is made between the amalgam filling and the moist fleshy tissues of the mouth, a small discharge of electrical current is observed. After discharge, the amalgam filling will slowly build up its electrical charge, which usually takes several minutes.

This discharge current is normally in the range of several microamps, and may also have a positive or negative polarity. Further, observation of specific electrical activity of the filling for the matrix of fillings has indicated that this electrical activity can potentially have an impact on the health of the person in whose mouth the filling exists both as a result of the electrical current itself and as a result of the current's effect on toxic metals which may form the amalgam.

Existing ammeters, while technically usable for measuring the current generated by a particular filling, have some shortcomings in providing repeatable, accurate test results, for two reasons. First, traditional ammeters measure RMS voltages which are proportional to the current source. In measuring the discharge from a filling, however, it is desirable to have a peak voltage measurement rather than an RMS measurement. Second, in measuring discharge current from a filling, it is desirable to measure the maximum current, that is, the peak current value, which necessitates a way of capturing that maximum value. Existing ammeters fluctuate with the current passing therethrough, so that is is necessary for an observer to visually note the highest reading that occurs during the particular time interval of current discharge. Such is not convenient in the measuring of a discharge current, since the discharge occurs immediately upon making electrical connection between the fleshy tissues and the filling and occurs in an inverval of about 0.2 to 0.5 seconds. Observation of this phenomenon normally requires two technicians, one to make the required contacts in the mouth of the patient and the other to monitor the ammeter.

Accordingly, there is a need for an ammeter that can measure a peak discharge current and which can capture the maximum value of the reading of a current discharge from the current source. This need includes such a device that displays the maximum value for a reasonable period of time allowing a single operator to activate discharge and then subsequently record the discharge data. Further, there is a need for such devices that can cycle through repetitive steps so that a series of measurements can be taken in an easy, convenient manner.

SUMMARY OF THE INVENTION

It is an object of the present invention to provide a novel and useful current-measuring device and method for measuring small currents in an easy, convenient manner.

It is a further object of the present invention to provide a current-measuring device and method that can capture a maximum peak value of a discharged current in such a manner that the maximum value is displayed for a selected interval of time subsequent to the discharge.

Yet another object of the present invention is to provide a current-measuring device which registers a maximum magnitude of a discharged current and which cycles through successive tests and ready modes.

It is a still further object of the present invention to provide a current-measuring device that activates only upon the receipt of a threshold current yet which records the maximum current received during a selected interval of time after the receipt of the threshold current.

To accomplish these objectives, the present invention employs a pair of electrical contacts in the form of probes that may be inserted into a patient's mouth. Upon the discharge of electrical current through the probes, the apparatus includes conversion circuitry that produces a voltage signal corresponding to the discharge current, that is, which has the same polarity as the discharge current and which has a magnitude that is proportional to that of the discharged current. This signed voltage is then presented to a first display that registers the polarity of the voltage, and to a rectifying circuit that produces a voltage magnitude signal that is proportional to the absolute value of the signed voltage. Capture circuitry monitors the voltage magnitude signal from the rectifying circuitry with the capture circuitry including charge-retaining elements that maintain a charge corresponding to the greatest value of the voltage magnitude. Display circuitry is connected to the charge-retaining element and is responsive to the charge thereon to generate an output signal that has a magnitude proportional to the charge on the charge-retaining element. This output signal is then presented to a second display, in the form of a conventional ammeter, which outputs the magnitude corresponding to the voltage magnitude signal.

In the preferred embodiment of the present invention, a system timing circuit cycles the ammeter through two modes of operation. A first mode, or read mode, occurs for a first period of time during which the circuitry monitors the discharge current. The second mode, or the display mode, occurs for a second period of time after the read mode. During the display mode, the circuitry is non-responsive to changes of current and, rather, the circuitry outputs the peak current value and polarity that was observed during the read mode. The system timing circuit then automatically causes a reset of the capture circuit by discharging the charge element.

Since it is desirable that the display not be activated until at least a minimum current is detected, a threshold latch circuit may be coupled to the capture circuitry and to the first display so that the capture circuitry and the first display are not operative until the threshold current is detected. When the capture circuit is activated, the timing circuit then causes the displays to output the captured value during the second interval of the timing cycle for the first interval of time and thus begins the cycle previously described. An override switch is provided to interrupt and override the timing circuit should the user desire a longer display mode period. Sensitivity adjustment controls may be provided both to the sensitivity of the meter and for the view time during which the displayed reading is held prior to the reset of the circuit.

From the above, the preferred method according to the present invention comprises the detection of the discharge current and the producing of a signed voltage signal in response to the discharge current with the signed voltage signal being proportional to the magnitude of the discharge current. The polarity of the signed signal is outputted, and the voltage signal is rectified. The magnitude of the rectified voltage signal is then monitored for a selected first interval of time and the greatest magnitude of the rectified voltage signal occurring during that period of time is outputted and displayed.

These and other objects, advantages, and features of the of the present invention will become more readily appreciated and understood when taken together with the following detailed description in conjunction with the accompanying drawings, in which:

DETAILED DESCRIPTION OF THE PREFERRED EMBODIMENT

The present invention is directed to an apparatus for measuring electrical currents, and specifically for measuring small discharge currents on the order of several microamperes. It is found particularly useful, and is especially constructed, for measuring small discharge currents such as those that occur when an electrical contact is made between the fleshy tissues of the human mouth and amalgam dental filling that has been placed in one or more of the person's teeth.

Figure 6:
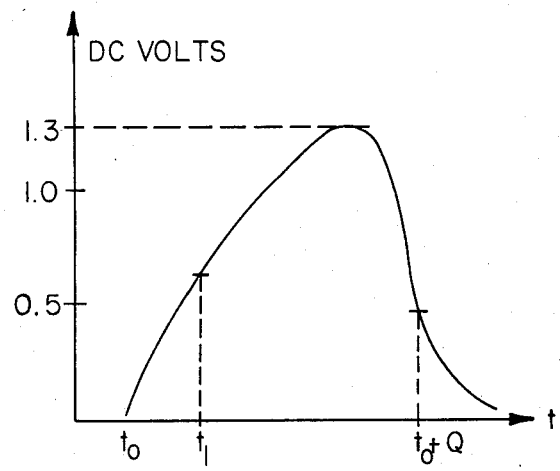
FIG. 6 is a graph of a typical discharge voltage from an amalgam filling in a human tooth.

As is known, when an amalgam of metals is placed in an acidic bath, electrical current may be generated depending upon the composition of the amalgam. In the case of a dental filling, a positive or negative electrical potential may be present between a filling and the fleshy tissues of the mouth, and, when electrical contact is made between the tissues and the filling, a current is discharged much in the manner of a small battery having a high internal resistance. FIG. 6 shows a sample curve of an electrical discharge between a filling and the fleshy tissues, and this discharge occurs during a small interval of time, usually less than 0.8 seconds. After discharge, it typically takes several minutes for the charge to again build up to its maximum value for a particular filling.

Figure 1:
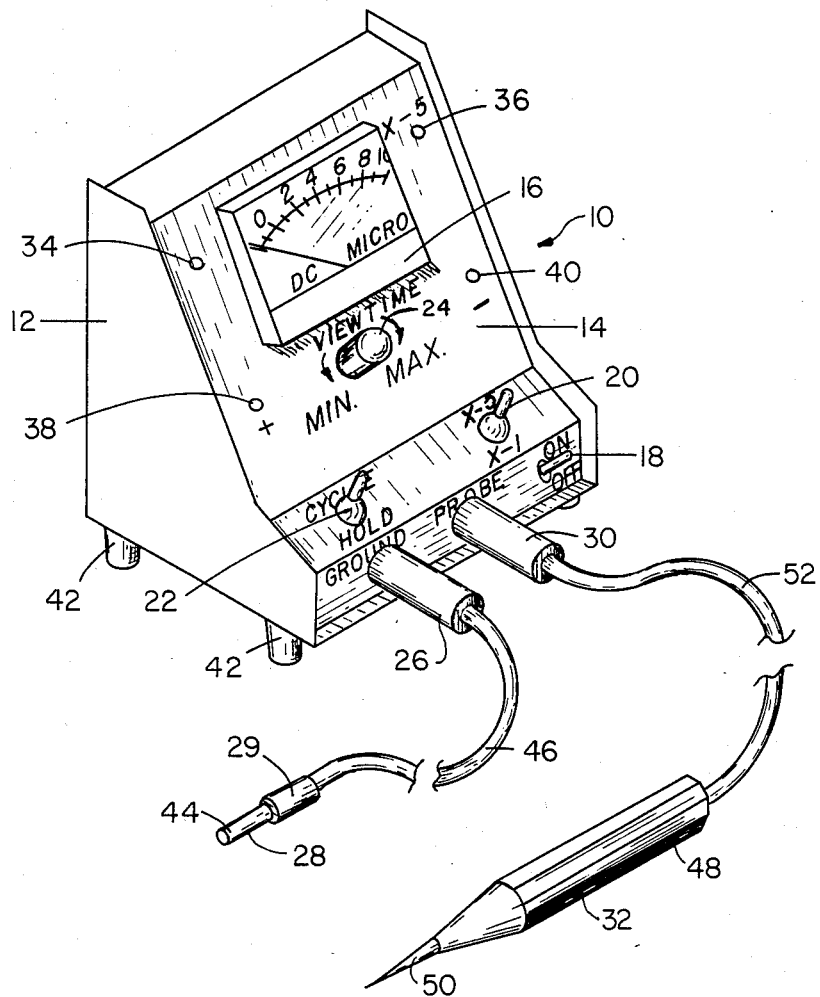
FIG. 1 is a perspective view of the current-measuring device according to the preferred embodiment of the present invention.

The preferred embodiment of the present device is therefore structured to accurately read this discharge current and to capture the maximum reading for a selected period of time during which the operator can note the value of the reading. To accomplish this measurement, the ammeter apparatus 10 according to the preferred embodiment of the present invention is shown in FIG. 1. Ammeter 10 includes a housing 12 having a front plate 14 that supports a microammeter 16 of a type that is commercially available. Plate 14 also includes three switches, an on/off switch 18, a sensitivity select switch 20, and an override switch 22. A cycle timing adjust knob 24 is also mounted on plate 14, and plate 14 includes female receptors for banana plug 26 for grounding probe 28 and banana plug 30 for probe 32 which are inputs for ammeter 10. A plurality of display diodes 34, 36, 38 and 40 are also visibly mounted on plate 14, with these diodes being standard light-emitting diodes and have as their purpose the indication of the various modes of operation of ammeter 10. Housing 12 is completed by a pair of sidewalls, a backwall, and a bottom wall, and housing 12 is supported by a plurality of rubber feet 42 on any convenient surface.

Grounding probe 28 is preferably formed as a U-shaped copper element having an outwardly-turned foot 44. Probe 28 is connected to the ammeter circuit, described below, by means of a flexible wire 46, attached to probe 28 by a connector 29. Probe 28 is constructed so that it may be positioned in a person's mouth with foot 44 extending under the person's tongue. In this manner, probe 28 makes electrical contact with the fleshy tissues of the mouth and acts as the ground for the ammeter circuit. Further, by its hooked configuration, probe 28 may easily set on the person's mouth without need for any extra support. Probe 32 has an outer housing constructed of plastic which encases a metal finger 50 that is electrically connected to wire 52. Wire 52 is connected to plug 30 so that finger 50 makes electrical contact with the electronic circuitry contained in housing 12. Thus, this device is constructed to measure a discharge current occurring between probe 28 and finger 50.

Figure 2:
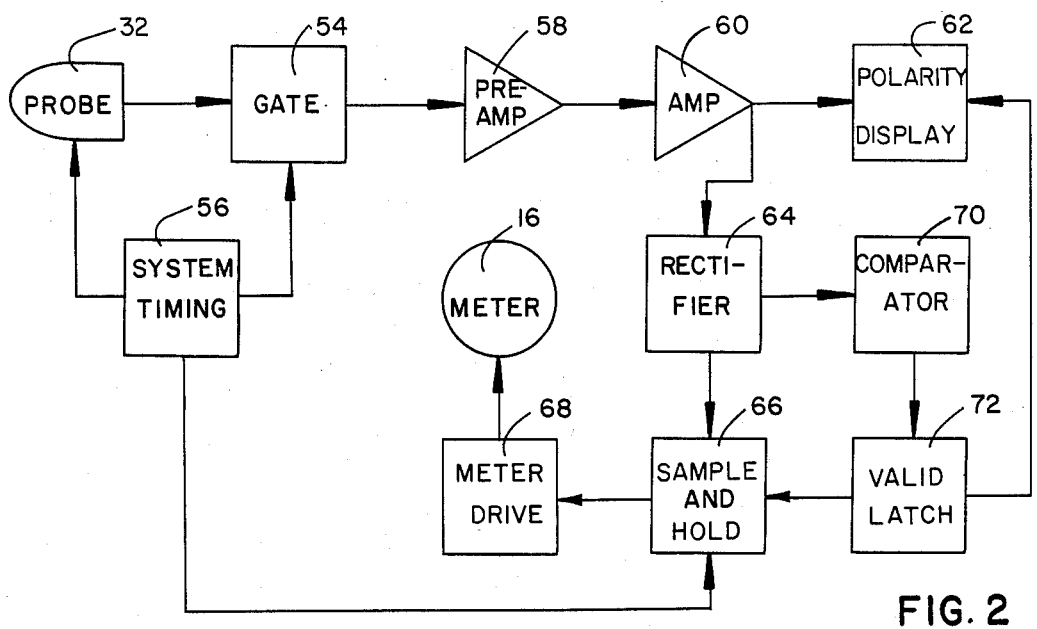
FIG. 2 is a diagramatic representation of the ammeter circuitry according to the preferred embodiment of the present invention.

FIG. 2 shows a block diagram of ammeter 10, and, thus, a flow diagram of the present invention. As is seen in this figure, probe 32 is electrically connected to a gate circuit 54 that may be activated by system timing circuit 56, described more fully below. Accordingly, gate 54 acts as a switch that allows the passage of an electrical current from probe 32 to a preamplifier circuit 58 and an amplifier circuit 60. Preamplifier 58 and amplifier 60 form a conversion circuit that changes the discharge current occurring between probes 28 and 32 into a voltage signal that is proportional in magnitude to the magnitude of the discharge current. Since this current may either flow from probe 32 to probe 28, which results in a positive current, or from probe 28 to probe 32, which results in a negative current, the corresponding converted voltage may be either a positive or negative voltage. Thus, polarity indicator circuit 62 monitors the voltage signal from amplifier 60 and operates to register the polarity of that voltage signal.

Amplifier 60 is also connected to a rectifier circuit 64 which generates a positive voltage signal corresponding to the magnitude of the signal from amplifier 60 regardless of the polarity of such signal. In this manner, rectifier 64, in a mathematical sense, provides the absolute value of the magnitude of the voltage signal from amplifier 60. This absolute value signal from rectifier 64 is presented to a sample and hold circuit 66 which includes charge-retaining circuit elements, discussed below, that receive and maintain a charge corresponding to the greatest value signal received from rectifier 64 during any selected interval of time. This greatest value signal is then passed to a meter drive circuit 68 which powers meter 16 to read the greatest value as maintained by sample and hold circuit 66.

The absolute value signal from rectifier 64 is also, in the preferred embodiment of the present invention, presented to a voltage comparator circuit 70 which compares the magnitude of the signal from recitifier 64 with a threshold value that may be internally set by comparator circuit 70. Comparator 70 tests this voltage magnitude signal with a base value, and, when a threshold condition is met, comparator 70 activates a valid latch circuit 72 to indicate the threshold event. Valid latch circuit 72 in turn activates both polarity indicator 62. System timing 56 causes a cycling of the ammeter system alternately between a "read" mode wherein gate 54 is closed and the discharge current is monitored and a "display" mode wherein gate 54 is open and a valid discharge reading is outputted.

Before turning to a detailed explanation of the electrical circuitry according to the preferred embodiment of the present invention, the operation of the preferred embodiment of the present device, as exemplified by FIG. 2, may now be more readily understood. When the device is turned on or activated, probe 28 is mounted in a patient's mouth, and the technician holds probe 32 in a condition ready to make contact with a dental filling in one of the patient's teeth. At this time, comparator 70 is searching for a threshold current between probes 28 and 32 and system timing 56 is cycling between the read and display modes. If no contact has been made, a threshold voltage does not exist during the read mode and so no display of the polarity occurs in the display mode interval since valid latch circuit 72 prohibits polarity indicator 60. The technician then makes contact with one of the dental fillings, and, assuming a current is discharged through the probes when system timing 56 closes gate 54, an increasingly larger magnitude current signal is passed through gate 54. When this current reaches the threshold magnitude value sought by comparator 70, comparator 70 activates valid latch 72 to indicate that a valid current is being detected. Valid latch 72 then activates polarity indicator 62 which registers whether the current is a positive current or a negative current. After the read mode, system timing 56 again opens system timing gate 54 for a second interval of time, the display mode. During the display mode, both the meter 16 and the polarity indicator 62 display the measured discharge characteristics.

During the read mode, which occurs during the first interval of time established by system timing 56, a discharge current, such as that graphically shown in FIG. 6, may pass through preamplifier 58, amplifier 60, and rectifier 64. As noted above, rectifier 64 presents an absolute value signal to sample and hold circuit 66 with the magnitude of the signal first increasing with time and subsequently decreasing or dropping off when the dental filling is discharged. Since it is desirable to measure the maximum peak value of this current, sample and hold circuit circuit 66 includes charge-retaining elements whose charge is continually built up to the maximum value, but, when the voltage magnitude signal begins to drop off, the charge-retaining element maintains its charge at this highest reading. The increasing voltage magnitude is outputted to meter 16, but it should be appreciated that the maximum value reading continues to be outputted to meter 16 even though the actual discharge current is dropping off.

After the first interval for the read mode lapses, system timing 56 opens gate 54 but continues to maintain sample and hold circuit 66 in an active state so that this maximum value is continued to be outputted to meter drive 68 and meter 16 during the display interval. After this second interval of time lapses, system timing 56 generates a reset pulse which signals sample and hold circuit 66 and causes the charge-retaining elements to discharge to ground; meter 16 then returns to a zero reading. System timing 56 then closes gate 54 to ready the device for the detection of another threshold current.

Figure 3:
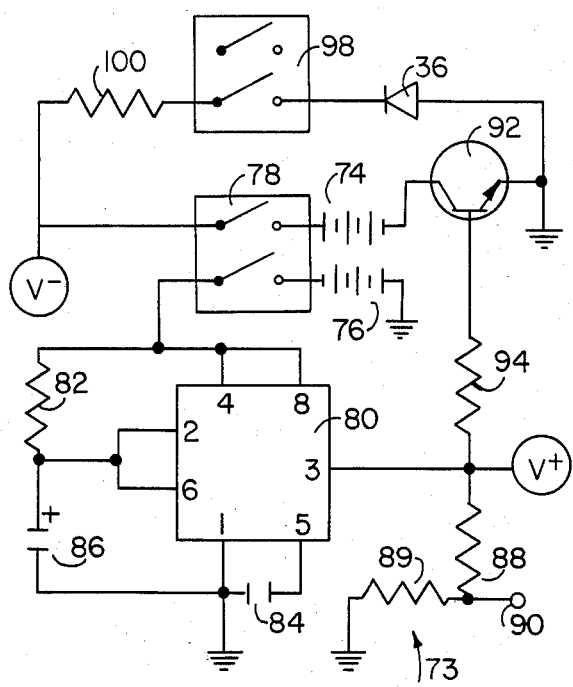
FIG. 3 is a circuit diagram of the power supply according to the preferred embodiment of the present invention.

From the foregoing, the detailed circuit of the preferred embodiment of the present invention may now be more readily appreciated. First, since it is necessary to power the apparatus, a power supply 73 is provided with power supply 73 preferably being battery operated. As is shown in FIG. 3, power supply 73 includes first and second batteries 74 and 76 which are connected through a single throw, double pole switch 78 which is operated by and corresponds to on/off switch 18 noted above. Battery 74 has its negative terminal outputted to negative voltage source V−, and this negative voltage is connected to various elements of the circuits, described below. Battery 76 has its positive terminal connected, through switch 78, to microtimer 80 which is preferably a NE555 chip which is commercially available as a timing microcircuit. At this point, it should be appreciated that the numbers contained within timer chip 80 and all other microchips in the circuit diagrams refer to the contact terminals of that specific chip. Terminals 2 and 6 of timer 80 are connected to each other and terminals 4 and 8 are connected to each other. These pairs are bridged by a resistor 82. Terminals 1 and 5 of timer 80 are bridged by capacitor 84. Terminals 1, 2, and 6 are also bridged by electrolytic capacitor 86, with its positive side being in contact with terminals 2 and 6 and resistor 82. Terminal 1 of timer 80 and the negative terminal of capacitor 86 are connected to ground, and terminal 3 is connected to this grounding point through resistors 88 and 89. This grounding point is also connected through resistor 89 to a battery test contact 90 which may allow a technician to test the status of batteries 74 and 76 without opening the device. Timer 80 passes the positive voltage V+ for the system and outputs V+ at terminal 3 which is also connected to the base of transistor 92 through resistor 94. Transistor 92 has its emitter connected to ground and through a diode 36 to a single pole, double throw switch 98. One switch element of switch 98 is connected through a resistor 100 to V−.

It should be apparent to the ordinarily skilled person in the art that the power supply circuit shown in FIG. 3 is a timed power supply circuit that, upon activation by activating switch 78, provides power to the system for a given period of time, after which the power supply automatically shuts off. The time of operation is determined by the variable resistor 82 and capacitor 86 selected to bridge the terminals of timer 80, as is well known in the art. In the embodiment described herein, this timer circuit operates for approximately six minutes before it automatically deactivates itself.

Figure 4:
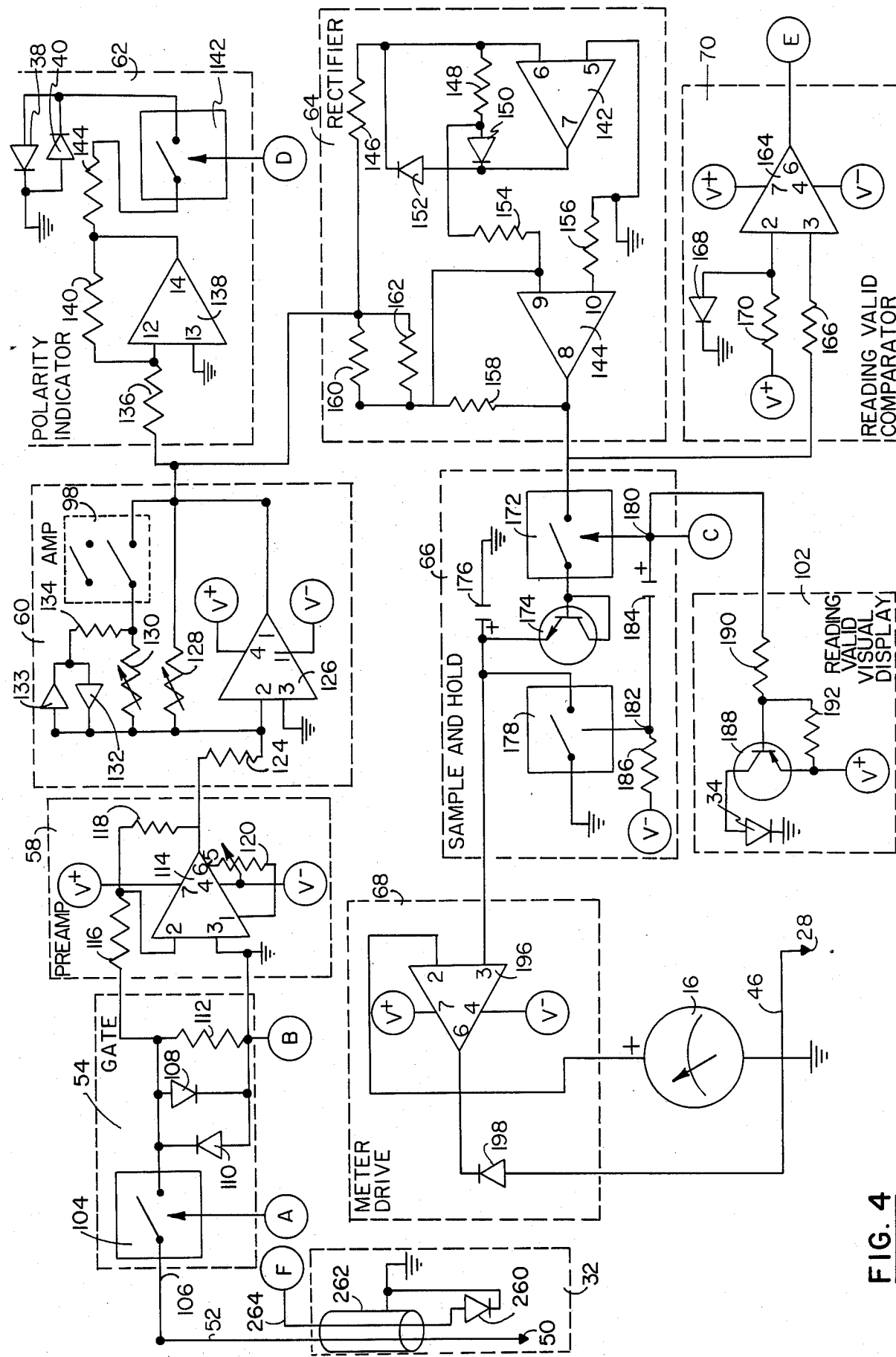
FIG. 4 is a circuit diagram of a majority of the main circuitry elements of the ammeter according to the preferred embodiment of the present invention.

FIG. 4 shows the circuitry for probe 32, gate 54, preamplifier 58, amplifier 60, polarity indicator 62, rectifier 64, comparator 70, sample and hold circuit 66, meter drive 68, meter 16, and a reading valid visual display 102. In this circuit, the letters A, B, C, D, and E are contact points with system timing circuit 56 shown in FIG. 5. Further, points V− and V+ are contact points to the power supply shown in FIG. 3.

As is shown in FIG. 4, gate 54 is a switch 104 which is operated by a signal from point A of system timing 56. Switch 104 is one stage of a 4016B CMOS bilateral switch, and, is connected, through input wire 106, to probe 32. When closed, a discharge current on wire 106 is presented to preamplifier 58 through switch 104. A pair of protective diodes 108 and 110 interconnect switch 104 to contact point B of system timing circuit 56, and a load resistor 112 also interconnects switch 104 to contact B, which is grounded.

Preamplifier 58 is formed by a CA 3140 FET input operational amplifier chip 114 connected at its terminal 2 to switch 104 through resistor 116. Chip 114 is wired in an inverting mode, which inverts the polarity of the incoming signal. Terminal 3 is connected to system timing contact point B and ground. Terminals 2 and 6 are bridged by resistor 118. Terminal 7 is connected to V+, and terminal 4 is connected to V− and to the variable contact point of a variable resistor 120 which bridges terminals 1 and 5 of chip 114.

Amplifier 60 is one stage of a LM 324 precision quad operational amplifier which is designated as op amp chip 126. Op amp chip 126 has its terminal 2 connected to terminal 6 of chip 114 through resistor 124. Chip 126 is connected in an inverting mode and is powered by power supply 73 by having terminal 4 connected to V+ and terminal 11 connected to V−. Terminal 3 of chip 126 is connected to ground, and a variable resistor 128 bridges terminal 1 and terminal 2 of chip 126. Thus, resistor 124 is connected to resistor 128 and terminal 2 of chip 126.

In order to increase the amplification of amplifier circuit 60, a second variable resistor 130 is connected in parallel with resistor 128 through the second pole of switch 98 which corresponds to switch 20 in FIG. 1. As noted with respect to FIG. 3, switch 98 has a first pole that activates light-emitting diode 36 as an indicator that switch 98 has been thrown, with the second pole then placing resistor 130 into the amplification circuit 60 so that the gain of the amplification circuit is increased. A pair of diodes 132 and 133 are connected in parallel to one another, with their polarities reversed, with this pair of diodes 132, 133 being connected in series with resistor 134. Diodes 132, 133 and resistor 134 are then connected in parallel with resistor 130, as is shown in FIG. 4. This provides a linearization subcircuit for amplifier 60.

Amplification circuit 60 is, as noted, wired in an inverting configuration so that it inverts the polarity of the signal coming from preamplifier 58. This inverted signal is outputted from terminal 6 of chip 126 and is presented both to polarity indicator 62 and to precision rectifier 64. It should thus be appreciated that, with the dual inverting caused by preamplifier 58 and amplifier 60, the polarity of the signal from terminal 6 of chip 126 is the same as the original polarity from probe 32.

Polarity indicator 62 is connected to amplifier 60 through resistor 136. Polarity indicator 62 is driven by chip 138 which is a second stage or gate of the precision quad operational amplifier chip discussed above. Chip 138 has its terminal 12 connected to resistor 136 and its terminal 13 connected to ground. Resistor 140 bridges terminals 12 and 14 of chip 138, and terminal 14 is connected, through resistor 144, to a second stage of the 4016B CMOS bilateral switch and is designated as switch 142. Switch 142 is connected on the opposite side of resistor 144 to ground through a pair of light-emitting diodes 38 and 40 which are connected in parallel with opposite polarities. Thus, when the voltage from terminal 14 of chip 138 is positive, diode 38 is active to indicate a positive voltage, and conversely, when the voltage on terminal 14 of chip 138 is negative, diode 40 is activated to indicate the negative polarity.

As noted above, amplification circuitry 60 is also connected to a precision rectifier 64 which is wired in a non-inverting configuration. Rectifier 64 includes a first chip 142 and a second chip 144. Chips 142 and 144 are the third and fourth stages of the precision quad operational amplifier. Thus, chips 126, 138, 142 and 144 are all defined by a single LM 324 operational amplifier device. Chip 142 has a terminal 6 which is connected to terminal 1 of chip 126 through resistor 146 and terminal 5 of chip 142 is connected to ground. Terminals 6 and 7 are bridged by a resistor 148 and a diode 150 connected in series with each other. Resistor 148 has one side connected to terminal 6 with the other side being connected to diode 150 which is arranged in a conducting mode from terminal 6 to terminal 7. A diode 152 also bridges terminals 6 and 7 of chip 142, with diode 152 being conductive in a direction from terminal 7 to terminal 6. A resistor 154 interconnects terminal 9 of chip 144 to the electrical connection between resistor 148 and diode 150. Terminal 10 of chip 144 is connected to ground through resistor 156. A resistor 158 bridges terminals 8 and 9 of chip 144, and pair of resistors 160 and 162, which are connected in parallel, interconnect terminal 9 of chip 144 to amplifier 60 at terminal 1 of chip 126. Rectifier 64 is connected, at terminal 8 of chip 144, to sample and hold circuitry 66 and reading valid comparator circuitry 70, as described below.

Comparator 70 includes a LM 741 operational amplifier chip 164 which has its number 4 terminal connected to V− and its number 7 terminal connected to V+. The third terminal of chip 164 is connected through resistor 166 to terminal 8 of chip 144. Terminal 2 of chip 164 is connected through diode 168 to ground, and through resistor 170 to V+. Output terminal 6 of chip 164 is connected to point E of the system timing and reading valid latch circuitry described below. Diode 168 and resistor 170 set the threshold comparison voltage for comparator 70.

Sample and hold circuitry 66 includes first switch 172 and a second switch 178 which are the third and fourth stages or gates of the 4016B CMOS bilateral switch, above. First switch 172 has one side connected to terminal 8 of chip 144 of rectifier 64. The second side of switch 172 is connected to the base of transistor 174, which is a 2N3904 NPN transistor, and it should be noted that the base and collector of transistor 174 are directly connected to one another thereby forming a high front-to-back ratio diode since this configuration substantially eliminates the effect of the transistor's minority carriers. The emitter of transistor 174 is connected to the positive terminal of electrolytic capacitor 176 which should be a low leakage capacitor such as a tantalum electrolytic capacitor. Capacitor 176 has its negative terminal connected to ground. Further, emitter of transistor 174 is connected to one side of switch 178, and the second side of switch 178 is connected to ground. Switch 172 is activated by a voltage potential at point 180, and switch 178 is activated by a voltage potential at point 182. Points 180 and 182 are connected through a tantalum electrolytic capacitor 184 having its positive terminal connected to point 180. Point 182 is connected through resistor 186 to $V^-$. Transistor 174 and capacitor 176 define the charge retaining circuit elements which maintain the peak current reading for the ammeter circuit according to the present invention.

Circuitry indicating that a reading is valid is provided by visual display 102 which includes transistor 188 which is 2N3906 PNP transistor having its base connected through resistor 190 to point 180. A resistor 192 bridges the emitter and base of transistor 188, and the collector of transistor 188 is connected through light-emitting diode 34 to ground. The emitter of transistor 188 is also connected to $V^+$ which provides a driving voltage for transistor 188.

In order to output the current detected by probe 32, sample and hold circuit 66 is connected to a meter drive comprising meter drive chip 196 which is a CA 3140 FET input operational amplifier. Chip 196 has its third terminal connected to the emitter of transistor 174. Terminal 4 of chip 196 is connected to $V^-$, and terminal 7 of chip 196 is connected to $V^+$. Terminals 2 and 6 of chip 196 are connected to each other, and terminal 6 is connected to the positive terminal of meter 16 which is a DC microammeter. The negative terminal of meter 16 is connected to ground and grounding probe 28, and a protective diode 198 extends from the negative to the positive terminals of meter 16 in order to prevent an unwanted overload that could damage meter 16.

Figure 5:
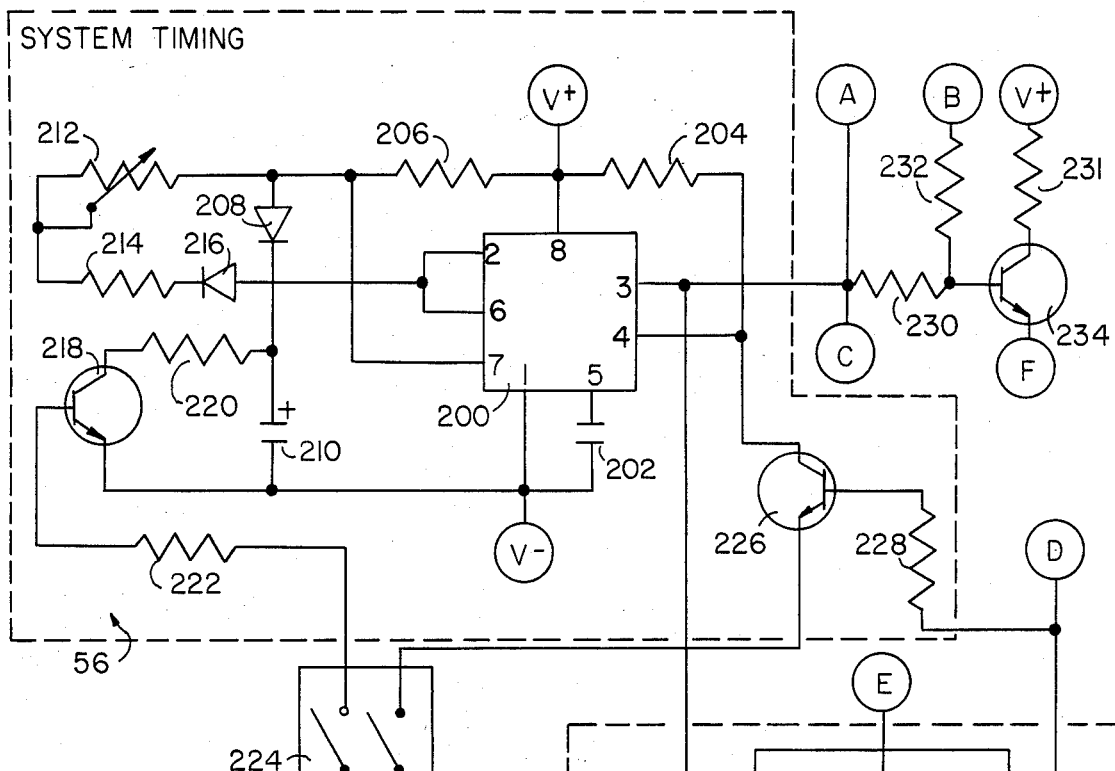
FIG. 5 is a circuit diagram of the system timing circuitry including the reading valid latch circuit according to the preferred embodiment of the present invention.

From the above description of the main circuitry of ammeter 10, it may now be appreciated that operation of this ammeter apparatus depends upon the switching of switches 104, 142, 172, and 178 which are all stages of a single CMOS bilateral switch device available commercially. Their switching is accomplished by system timing circuit 56, which is shown in detail in FIG. 5. System timing circuit 56 primarily comprises NE555 microprocessing chip 200, which is also commercially available. Terminal 1 of chip 200 is connected to $V^-$, and terminal 8 of chip 200 is connected to $V^+$. Terminals 1 and 5 of chip 200 are bridged by capacitor 202, and terminals 4 and 8 are bridged by resistor 204. Terminals 7 and 8 of chip 200 are bridged by resistor 206, and terminals 2 and 6 of chip 200 are connected to one another. Terminals 7 and 6 of chip 200 are connected to each other through diode 208, and terminals 1 and 6 are bridged by electrolytic capacitor 210 having its positive pole electrically connected to terminal 6. A variable resistor 212 is connected in series with resistor 214 and diode 216, as is shown in FIG. 5, with this two resistor and diode system being connected in parallel with diode 208 across terminals 6 and 7 of chip 200. A transistor 218 has its collector connected through resistor 220 to terminals 2 and 6 of chip 200. The emitter of transistor 218 is connected to $V^-$ and to the negative pole of capacitor 210. The base of transistor 218 is connected, through resistor 222, to override switch 224 which is switch 22 in FIG. 1. A second transistor 226 has its emitter connected to a second pole of switch 224, and has its collector connected to terminal 4 of chip 200. The base of transistor 226 is connected through resistor 228 to point D. Terminal 3 of chip 200 is also connected to points A and C and is connected to point B through resistor 230 and resistor 232. Terminal 3 is also connected to the base of probe drive transistor 234 through resistor 230. The emitter of transistor 234 is connected to point F, and its collector is connected to $V^+$ through resistor 231.

A reading valid latch circuit 250 is interconnected with system timing 56, and comprises a chip 252 which is a 4013 CMOS D-Flipflop switch wired in a self-toggling configuration. Chip 252 has a first terminal connected to point D, and a sixth terminal connected to point E. Terminals 2 and 5 of chip 252 are interconnected with one another, with terminal 5 being connected to a second side of the first pole of switch 224 opposite resistor 222. Terminals 3 and 14 of chip 252 are interconnected to one another and to $V^+$, and terminals 4 and 7 of chip 252 are bridged by resistor 254, with terminal 7 of chip 252 also being connected to $V^-$. Terminal 4 of chip 252 is also connected, through capacitor 256, to the second side of the second pole of switch 224, opposite the emitter of transistor 226 and to terminal 3 of chip 200.

Again referring to FIGS. 4 and 5, it may now be appreciated that the emitter of transistor 234 drives a light-emitting diode 260 in probe 32 which indicates that the probe 32 is "active." When probe 32 is "active," the ammeter system is in the read mode according to system timing 56. Probe 32, as noted, has a contact 50 which is connected to gate 104 through electrical leads 52 and 106. Lead 52 is preferably a cable having shielding 262 which is connected to ground. Diode 260 is grounded to shield 262 and is connected by lead 264, which is shielded by shielding 262, to transistor 234 at point F. Probe 28 is grounded, in FIG. 4, to meter 16 through ground input lead 46.

Based on the foregoing description of the circuitry of the preferred embodiment of the present invention, the operation of this novel ammeter may now be more fully understood and appreciated. In this regard, it should now be understood that the present device can be operated in two different modes, a cycle mode and a hold mode.

In the cycle mode, switch 224 is open. When ammeter 10 is activated by closing both poles of switch 78, system timing 56 begins to cycle through the read mode and the display mode, as noted above. When system timing 56 is in the read mode, system timing 56 generates timing pulses that closes gate 104 and switch 172. In addition, diode 260 is lit to indicate that the probe is in an active, or signal receiving, state. At the end of the read mode, system timing 56 opens gate 104 and switch 172 so diode 260 is turned off. At the end of the display mode, system timing 56 generates a very short duration pulse that closes switch 178 allowing the discharge of capacitor 176 to ground. After this brief pulse, switch 178 again opens so that a charge may be built up once more on capacitor 176. Thus, it should be understood that the system is only in a condition to take a reading when it is in a read mode. If system timing 56 has not placed the ammeter circuits in a read mode, no signal may pass through gate 104.

The interaction of latch 250, comparator 70 and system timing 56 can now be more fully understood. Specifically, latch 250 is wired in a self toggling configuration. Terminal 1 of chip 252 is at a normally low voltage and terminal 2 is at a normally high voltage. Since terminals 2 and 5 are interconnected, terminal 5 of 252 is likewise normally high. When a threshold signal is detected by comparator 70, however, chip 164 generates a hard positive voltage that is applied to terminal 6 of chip 252. This voltage causes terminal 1 to flip to a high voltage and simultaneously terminals 2 and 5 to flip to a low voltage. This causes switch 142 to close thereby indicating polarity. Chip 252 remains in this state until system timing 56 generates a short duration pulse on terminal 4 of chip 252 which causes chip 252 to flop back into its original state. This "flop" occurs at the end of the display cycle, and it should be appreciated that when the chip 252 is "flipped" meter 16 and one of diodes 38 and 40 indicate the value of the discharge current. Accordingly, a display may be observed even while the system is in the read mode since a threshold current has been detected. This display continues, then, during the full display mode, but any discharge current that occurs during the display mode does not affect the displayed value since system timing 56 has opened gate 104.

In the hold mode, switch 224 is closed so that system timing 56 is, in a sense, overridden. Switch 224 may be closed when there is either a charge on capacitor 176, and therefore a reading on meter 16, or when no charge or reading is present. In the first instance, which occurs during the display mode of the system, the closing of switch 224 prevents the reset pulse from affecting chip 252. Thus, meter 16 and one of diodes 38 and 40 continue to display the status of the last peak discharge current, and no resetting of the device occurs. Resetting only takes place, then, when switch 224 is opened.

On the other hand, if at the time switch 224 is closed there is no valid reading, system timing 56 cycles to the beginning of the read mode and awaits a valid discharge current to be detected. When the valid current is detected, system timing completes the read cycle so that the discharge current is passed through the system and capacitor 176 is charged to the peak value that occurs during the read cycle. Once the read cycle is completed and system timing 56 opens gate 104, the device operates in the same manner as if switch 224 was closed when a valid display already was present, as described above. In this manner, then, a "snapshot" reading may be obtained.

In actual use, a technician activates the device by closing switch 78 and by selecting the sensitivity of the meter by means of switch 98. When switch 98 is closed, resistor 130 is placed in the circuit and diode 96 is lit to indicate that the scale of meter 16 is in the X5 mode. The technician also chooses whether the device is to be operated in the cycle mode or the hold mode, as described above. Once these selections are made, the ammeter apparatus is ready for operation and probe 28 is placed in the mouth of the patient so that it makes electrical connection to the fleshy tissue of the patient's mouth. When contact 50 of probe 32 is placed on a current discharge source, such as a filling, a current will be presented to gate 104 by wire 106.

Gate 104 is open or closed depending on the status of switch 224 and cycle timing 56. When closed, this current will pass to preamplifier 58 where an inverted voltage magnitude signal is generated that is proportional to the magnitude of the current at gate 104. This inverted voltage magnitude signal is increased in magnitude by amplifier 60. Amplifier 60 again inverts the polarity of the signal so that the polarity of the signal from amplifier 60 corresponds to the polarity of the original signal. This polarized signal is presented to polarity indicator 62, but, since chip 142 is normally open, neither diode 146 nor diode 148 registers any polarity. The signal from amplifier 60 is also presented to rectifier 64 which generates a positive voltage signal regardless of the polarity of the signal from amplifier 60, with this positive voltage magnitude signal having a magnitude corresponding to the magnitude of the signal from amplifier 60 and thus corresponds to the magnitude of the original current detected by the probe. Rectifier 64 is necessary since this magnitude signal is presented to comparator 70 which compares the magnitude with a reference or threshold magnitude defined by resistor 170.

At this point, it is appropriate to refer to FIG. 6 which shows the typical discharge curve of a dental filling. When contact 50 is placed against the filling, and, when gate 104 is closed at time $T_0$, the filling begins to discharge, until, at $T_1$ the discharge current creates a voltage, on terminal 3 of chip 164 that is equal to the threshold current. At this point, comparator 70 generates the hard positive voltage at point E which causes reading valid latch 250 to close and generate a hard positive voltage on point D. The positive output D closes switch 142 so that diodes 146 and 148 register the polarity of the threshold signal.

During the read interval "a," the discharge current is registered by the system. This occurs between time $T_0$ and $T_{0+a}$ in FIG. 6, and the peak voltage magnitude signal during interval "a" becomes impressed on capacitor 176. In FIG. 6 this corresponds to a DC voltage of approximately +1.3 volts. When switch 104 and switch 172 are opened, changes in the current on gate 104 and from rectifier 64 do not affect the charge on capacitor 176. Since capacitor 176 maintains a voltage potential on terminal 3 of chip 196 of meter drive 68, meter 16 outputs a reading which corresponds to the charge on capacitor 176. This reading will be maintained until such time that capacitor 176 is discharged, which occurs automatically after the second interval or display interval "b" according to system timing 56. After receipt of a threshold signal, reading valid visual display 102 indicates that a threshold signal has been received.

Upon determination of a second interval or read interval b, system timing circuit 56 generates a signal on point C that causes switch 178 to close and switch 172 to open. When this occurs, capacitor 176 is connected to ground so that capacitor 176 discharges therefore releasing the reading has been maintained on meter 16. A signal is generated on point D that opens switch 142 so that the polarity indicator is voided and the reading valid visual display is also voided. System timing 56 then closes gate 104 and switch 172 and the device is reset to take a second reading. In the preferred embodiment of the present invention, the length of interval a is preset by resistor 206, and the length of interval b may be conveniently set by resistor 214 and by variable resistor 212 which is connected to adjust knob 24 shown in FIG. 1.

In the circuit, the types of the various processing chips have been set forth. All transistors are 2N3904 npn transistors, except for transistor 188 which is a 2N3906 pnp device, all light-emitting diodes are common, low current diodes chosen to display an "on" state rather than for circuit affecting properties, and the remaining diodes are 1N914 devices. The following table represents the values of the resistors and capacitors of this ammeter circuit:

COMPONENT TABLE

Resistors (in ohms)

| | | | | | |
|---|---|---|---|---|---|
| 82 | 5600K | 140 | 100K | 192 | 47K |
| 88 | 1000K | 144 | 240 | 204 | 2.2K |
| 89 | 3900K | 146 | 10K | 206 | 15K |
| 94 | 10K | 148 | 10K | 212 | 0–100K |
| 100 | 100 | 154 | 4700 | 214 | 47K |
| 112 | 1000 | 156 | 2700 | 220 | 10K |
| 116 | 3300 | 158 | 10K | 222 | 100K |
| 118 | 330K | 160 | 10K | 228 | 20K |
| 120 | 100K | 162 | 33K–220K* | 230 | 27K |
| 124 | 3300 | 166 | 100K | 231 | 240 |
| 128 | 0–20K | 170 | 100K | 232 | 33K |
| 130 | 0–20K | 186 | 10K | 254 | 270 |
| 134 | 3900 | 190 | 68K | | |
| 136 | 10K | | | | |

Capacitors (in microfarads)

| | | | | | |
|---|---|---|---|---|---|
| 84 | .0022 | 184 | 1 | 256 | .1 |
| 86 | 47 | 202 | .0022 | | |
| 176 | 1 | 210 | 47 | | |

*Factory selected value to match precision rectifier

From the foregoing, it should now be appreciated that the method according to the preferred embodiment of the present invention includes the detecting of the discharge current through electrical contacts and producing a signed voltage signal in response to the discharge current with the signed voltage signal having a magnitude proportional to the magnitude of the discharge current. The polarity of the signed voltage signal is outputted and displayed while the voltage signal itself is rectified. After the voltage signal is rectified, the method includes the step of outputting and displaying the greatest magnitude of the rectified voltage signal occurring during a selected first interval of time.

In the preferred embodiment of the present invention, this method also includes the step of prohibiting any output of display of the polarity of the voltage signal and of the magnitude of the rectified voltage signal until the magnitude of of the rectified voltage signal at least equals a preselected threshold value. Further, the preferred method may include the step of maintaining a charge-retaining element at a charge corresponding to the maximum value of the rectified voltage signal which occurred during the first interval of time with the step of outputting and displaying the greatest magnitude of the rectified voltage signal comprising the outputting and displaying the charge value of the charge-retaining element. This step of outputting and displaying the greatest magnitude of rectified voltage signal, as well as the step of outputting and displaying the polarity of the voltage signal, may preferably occur for a selected second interval of time after termination of the first interval of time. Following the second interval of time, the polarity and magnitude values are removed from the displays, and the charge-retaining element is discharged.

The preferred method may also include the step of automatically cycling the outputting and displaying steps, described above, through successive cycles wherein each cycle comprises a first and second interval of time as well as the step of removing the displayed polarity and magnitude values and the discharging of the charge-retaining element. Finally, the step of overriding the automatic cycling step is provided in the preferred method. All of these steps, of course, are accomplished by the apparatus described above.

Embodiments of the present invention have been shown and described with a degree of particularity to enable a complete and full understanding of those embodiments. If should be understood, however, that the present invention involves inventive concepts defined in the appended claims, and these inventive concepts are not intended to be limited by the detailed description herein beyond that required by the prior art and as the claims are allowed. The Ammeter Apparatus and Method for Capturing Current Readings of the present invention can take other forms and is susceptible to various changes in detail of structure without departing from the principles of this invention.

We claim:

1. Apparatus for measuring a maximum electrical current occurring from a current source during a selected interval of time comprising:
   first and second electric inputs adapted to be electrically connected to said source;
   conversion means connected to said inputs for receiving an electrical current therefrom and producing a signed voltage proportional to the magnitude of said current;
   gate means between at least one of said inputs and said conversion means for passing said current when closed and prohibiting passage of said current when open;
   first display means electrically connected to said conversion means for indicating the polarity of said voltage;
   rectifying circuitry electrically connected to said conversion means and operative to produce a voltage magnitude signal proportional to the absolute value of the signed voltage;
   capture circuitry having a charge-retaining element receiving said voltage magnitude signal and maintaining a charge corresponding to the maximum value of said voltage magnitude signal;
   reset means for discharging said charge-retaining element;
   first timing circuitry for closing said gate means during a first interval of time, for opening said gate means during a second interval of time and for resetting said capture circuitry at the end of said second interval of time, said first timing circuitry means incorporating said reset means and including means for varying the duration of said second interval of time;
   display circuitry means responsive to the charge on said charge-retaining element for generating an output signal having a magnitude proportional to said charge;
   second display means for receiving said output signal and displaying the magnitude of said output signal; and
   power supply means associated with said conversion means and said display circuit means.

2. Apparatus according to claim 1 including threshold latch means electrically connected to said rectifying circuitry and said capture circuitry for enabling said capture circuitry when said voltage magnitude signal has a value greater than or equal to a preselected value.

3. Apparatus according to claim 2 wherein said threshold latch means enables said first display means when said voltage magnitude signal has a value greater than or equal to said preselected value.

4. Apparatus according to claim 2 including override means associated with said first timing circuitry means for prohibiting the resetting of said capture circuitry upon termination of said second interval of time.

5. Apparatus according to claim 4 wherein said override means includes a manual switch.

6. Apparatus of claim 3 including third display means for indicating that said voltage magnitude signal has a value greater than or equal to said preselected value.

7. Apparatus according to claim 1 including first and second probes releasably connectable to said first and second inputs, respectively.

8. Apparatus according to claim 1 including sensitivity adjustment means for selectively varying the proportionality of the magnitude of said signed voltage to said electrical current.

9. Apparatus according to claim 1 including second timing circuitry means associated with said power supply for automatically disabling said power supply upon termination of a third preselected time interval.

10. Apparatus for measuring electrical currents, comprising:
   an input operative to receive a current signal indicative of the magnitude and polarity of an electrical current;
   a charge-retaining element electrically connected to said input;
   first gate means between said charge-retaining element and an electrical ground for discharging said charge-retaining element when closed and permitting said charge-retaining element to become charged when open;
   second gate means between said input and said charge-retaining element for passing said current signal when closed and prohibiting passage of said current signal when open;
   timing circuitry means for closing and opening the first gate means for first and second intervals of time, respectively, said timing circuitry including means for varying the second interval of time; and
   a display operative to display a value indicative of the charge on said charge-retaining element.

11. Apparatus according to claim 10 including a timing circuit operative to open and close said first and second gate means at a preselected relative interval.

12. Apparatus according to claim 11 including a polarity indicator electrically connected to said input and operative to indicate the polarity of said current signal.

13. Apparatus according to claim 11 including amplification means for amplifying said current signal and electrically located between said second gate means and said charge-retaining element.

14. Apparatus according to claim 13 wherein said amplification means includes a preamplifier stage electrically connected in an inverted configuration and an amplifier stage electrically connected in an inverted configuration with respect to said preamplifier stage.

15. Apparatus according to claim 13 including a third gate means between said amplification means and said charge-retaining element for passing current to said charge-retaining element when closed and prohibiting passage of current when open, and a threshold detector means cooperating with said timing circuitry for closing said third gate means upon receipt of at least a preselected threshold value of current magnitude from said amplification means.

16. Apparatus according to claim 15 including fourth gate means for switching said polarity indicator on and off when closed and open, respectively, said threshold detector means closing said fourth gate means upon receipt of said threshold current value, said timing circuit including means for selectively opening said fourth gate means.

17. Apparatus according to claim 15 wherein said timing circuit includes means for selectively opening said third gate means.

18. Apparatus according to claim 15 including a valid display operative to indicate that said third gate means is closed.

19. Apparatus according to claim 15 including rectification means between said amplification means and said third gate means for rectifying said current signal.

20. Apparatus according to claim 10 including an electrical probe releasably connectable to said input and having a visual indicator operative to indicate that said second gate means is closed.

21. Apparatus according to claim 20 including a ground input and a second probe releasably connectable to said ground input.

22. Apparatus according to claim 11 including a power supply operative to provide electrical energy for said timing circuit.

23. Apparatus according to claim 22 wherein said power supply includes a timing means for disabling said power supply after a preselected interval of time from activation of said power supply.

24. A method of measuring small discharge currents from a current source, comprising the steps of:
   detecting said discharge current through electrical contacts placed in a conductive relationship with said current source;
   producing a signed voltage signal in response to said discharge current that has a magnitude proportional to the magnitude of said discharge current;
   outputting and displaying the polarity of said voltage signal;
   rectifying said voltage signal; and
   maintaining a charge-retaining element at a charge corresponding to the maximum value of said rectified voltage signal occurring during a selected first interval of time, outputting and displaying of the charge on said charge-retaining element for a second interval of time after termination of said first interval of time; and
   removing the displayed polarity and magnitude values and discharging said charge-retaining element after said second interval of time, said first and second intervals of time being automatically predetermined.

25. The method according to claim 24 including the step of automatically cycling the outputting and displaying steps through successive cycles each comprising said first and second intervals of time and the removal of the displayed polarity and magnitude values and the discharging of said charge-retaining element.

26. The method according to claim 25 including the step of selectively overriding said automatic cycling step.

27. The method according to claim 24 further including the step of prohibiting the outputting and displaying of the polarity of said voltage signal until the magnitude of said rectified voltage signal at least equals a preselected threshold value.

* * * * *